(12) United States Patent
Harada et al.

(10) Patent No.: US 8,023,112 B2
(45) Date of Patent: Sep. 20, 2011

(54) ALIGNMENT APPARATUS AND FABRICATION APPARATUS FOR PLANAR MEMBER AND ALIGNMENT METHOD AND FABRICATION METHOD FOR PLANAR MEMBER

(75) Inventors: Tohru Harada, Kawasaki (JP);
Kazuhisa Mishima, Kawasaki (JP);
Hirokazu Yamanishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/882,812

(22) Filed: Sep. 15, 2010

(65) Prior Publication Data

US 2011/0001974 A1 Jan. 6, 2011

Related U.S. Application Data

(63) Continuation of application No. PCT/JP2008/056402, filed on Mar. 31, 2008.

(51) Int. Cl.
*G01B 11/00* (2006.01)
(52) U.S. Cl. .................. 356/401; 356/614; 356/620
(58) Field of Classification Search .......... 359/399–401; 257/797; 382/141, 145
See application file for complete search history.

(56) References Cited

U.S. PATENT DOCUMENTS

| 6,411,387 B1 * | 6/2002 | Kaneko et al. .............. 356/401 |
| 6,744,512 B2 * | 6/2004 | Takahashi .................. 356/401 |
| 7,876,439 B2 * | 1/2011 | Ausschnitt et al. .......... 356/401 |
| 2008/0230929 A1 * | 9/2008 | Shin et al. .................. 257/797 |

FOREIGN PATENT DOCUMENTS

| JP | 63-142324 A | 6/1988 |
| JP | 5-074666 A | 3/1993 |
| JP | 2001-274058 A | 10/2001 |
| JP | 2001-291648 A | 10/2001 |
| JP | 2002-243412 A | 8/2002 |
| JP | 2004-306164 A | 11/2004 |
| JP | 2005-317806 A | 11/2005 |
| JP | 2006-005187 A | 1/2006 |
| JP | 2006-119321 A | 5/2006 |

OTHER PUBLICATIONS

International Search Report of PCT/JP2008/056402, mailing date May 20, 2008.

* cited by examiner

*Primary Examiner* — Layla Lauchman
(74) *Attorney, Agent, or Firm* — Westerman, Hattori, Daniels & Adrian, LLP

(57) ABSTRACT

An alignment apparatus for a planar member includes, an image capturing unit which captures an image of a rotationally asymmetrical alignment mark provided on the planar member, a position detection unit which detects a position of the alignment mark from the image, a position adjusting unit which adjusts, based on the detected position of the alignment mark, the position of the planar member relative to a reference position, and an orientation detection unit which detects an orientation of the planar member based on the rotational asymmetry of the alignment mark captured in the image.

20 Claims, 24 Drawing Sheets

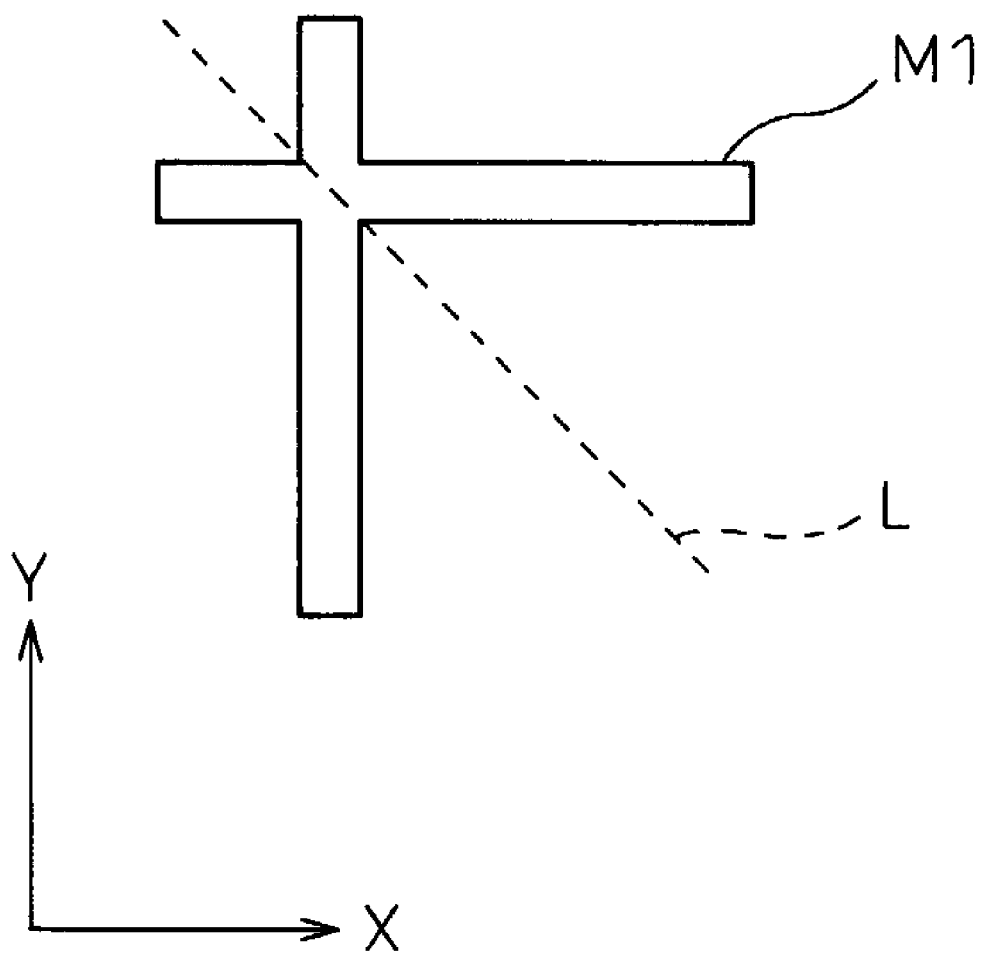

ALIGNMENT APPARATUS AND FABRICATION APPARATUS FOR PLANAR MEMBER AND ALIGNMENT METHOD AND FABRICATION METHOD FOR PLANAR MEMBER

CROSS-REFERENCE TO RELATED APPLICATIONS

The present application is a continuation application based on International application No. PCT/JP2008/056402, filed on Mar. 31, 2008.

FIELD

This application is concerned with an alignment apparatus and method for use in a fabrication process of a transparent panel or sheet, such as a liquid crystal panel, electronic paper, or organic EL (Electro-Luminescence) panel, or a circuit substrate, a semiconductor integrated circuit, or the like, for performing alignment of such planar components or such planar members as photomasks used, for example, in a semiconductor integrated circuit fabrication process.

BACKGROUND

In a fabrication apparatus that handles planar workpieces, such as panels, sheets, semiconductor wafers, etc., or planar members, such as photomasks, etc., and more particularly, in a fabrication apparatus that processes and laminates together liquid crystal, electronic paper, organic EL, or like members or that processes and assembles circuit substrates, or in a fabrication apparatus for a semiconductor integrated circuit or the like, the alignment of such planar workpieces or members is performed by automatically detecting their positions. For simplicity, in the description given herein, workpieces such as panels, sheets, substrates, semiconductor wafers, etc., and members such as photomasks, etc., on the fabrication apparatus side, may be simply referred to as "workpieces".

Japanese Laid-open Patent Publications No. 2002-243412 and No. 2005-317806 each disclose a method for alignment of a printed substrate and a glass plate by detecting marks provided on the printed substrate and the glass plate, respectively. Japanese Laid-open Patent Publication No. 2006-119321 discloses a structure in which alignment marks are provided on a liquid crystal display panel and a flexible substrate, respectively, for alignment of these two members. Japanese Laid-open Patent Publication No. 2006-5187 discloses a method for detecting the orientation of a printed substrate by using a plurality of positioning marks.

SUMMARY

According to one embodiment, there is provided an alignment apparatus for a planar member including an image capturing unit which captures an image of a rotationally asymmetrical alignment mark provided on the planar member, a position detection unit which detects a position of the alignment mark from the image, a position adjusting unit which adjusts, based on the position of the alignment mark, the position of the planar member relative to a predetermined reference position, and an orientation detection unit which detects an orientation of the planar member based on the rotational asymmetry of the alignment mark captured in the image.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 7 is a diagram illustrating the line symmetry of the alignment mark depicted in FIG. 2;

DESCRIPTION OF EMBODIMENTS

Figure 1:
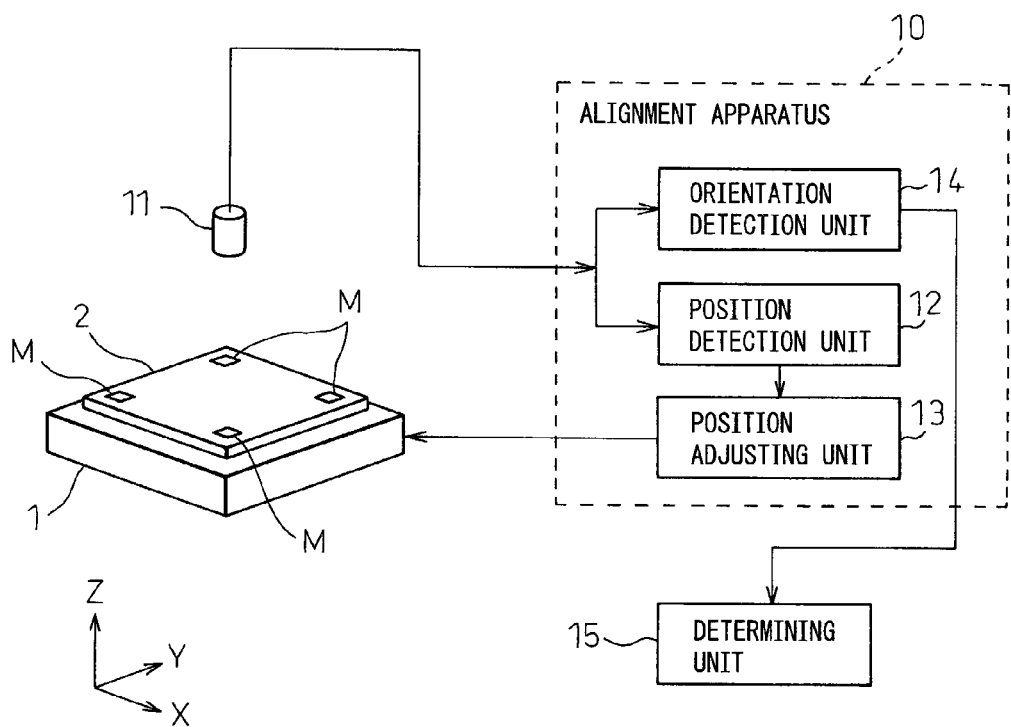
FIG. 1 is a diagram illustrating the configuration of an embodiment of an alignment apparatus.

Embodiments will be described below with reference to the accompanying drawings. FIG. 1 is a diagram illustrating the configuration of an embodiment of an alignment apparatus. The alignment apparatus 10 is an apparatus for aligning a planar member 2 with respect to a reference position when the planar member 2, such as a plate or sheet-like member, is placed horizontally in an XY plane as illustrated.

The alignment apparatus 10 includes an image capturing unit 11 which captures an image of a prescribed alignment mark M provided on a surface of the planar member 2, a position detection unit 12, which detects the position of the alignment mark M from the image captured by the image capturing unit 11, a position adjusting unit 13 which adjusts the position of the planar member 2 relative to the reference position, based on the position of the alignment mark M detected by the position detection unit 12, and an orientation detection unit 14 which detects the orientation of the planar member 2 based the image captured of the alignment mark.

In the configuration example of FIG. 1, the position adjusting unit 13 moves the planar member 2 by driving a moving stage 1 on which the planar member 2 is placed, and thereby adjusts the position of the planar member 2 relative to the position of a member or component to which the planar member 2 is to be aligned (i.e., the reference position). However, instead of or in addition to moving the planar member 2, the adjustment of the position of the planar member 2 relative to the reference position may be accomplished by moving the member or component to which the planar member 2 is to be aligned.

Figure 2:
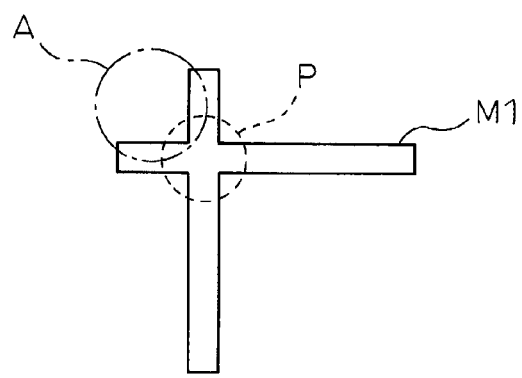
FIG. 2 is a diagram illustrating a first example of an alignment mark.

FIG. 2 is a diagram illustrating a first example of the alignment mark. The position detection unit 12 detects the position of the alignment mark M1 by detecting, through image processing, the position of the portion of the alignment mark M1 indicated at reference character P. More specifically, the position detection unit 12 detects, in the image captured by the image capturing unit 11, the position P of the alignment mark M1 by performing pattern matching between the image captured by the image capturing unit 11 and the prestored image identical in shape to the alignment mark M1.

Further, since the alignment mark M1 has a rotationally asymmetrical shape as illustrated, the orientation of the planar member 2 can be detected by detecting the direction in which the portion indicated at reference character A is oriented in the image of the alignment mark M1 captured by the image capturing unit 11.

The "orientation" or "direction" of the planar member 2 refers to the orientation or direction within the plane in which the planar member 2 is placed, i.e., the plane (in the example of FIG. 1, the XY plane) parallel to the surface on which the alignment mark M1 is formed.

Further, if the alignment mark M1 can be seen from below the planar member 2 because, for example, the planar member 2 is transparent, the term "orientation" or "direction" may be used to indicate which of the upper and lower surfaces of the planar member 2 faces the image capturing unit 11.

The orientation detection unit 14 performs pattern matching between the image captured by the image capturing unit 11 and the prestored image identical in shape to the alignment mark M1 by rotating the prestored image in increments of a predetermined angle, and detects the orientation of the alignment mark M1 in the image captured by the image capturing unit 11. Information indicating the orientation detected by the orientation detection unit 14 is supplied to a determining unit 15. The determining unit 15 determines whether the planar member 2 is oriented in the correct direction by referring to the orientation detected by the orientation detection unit 14.

Figure 3:
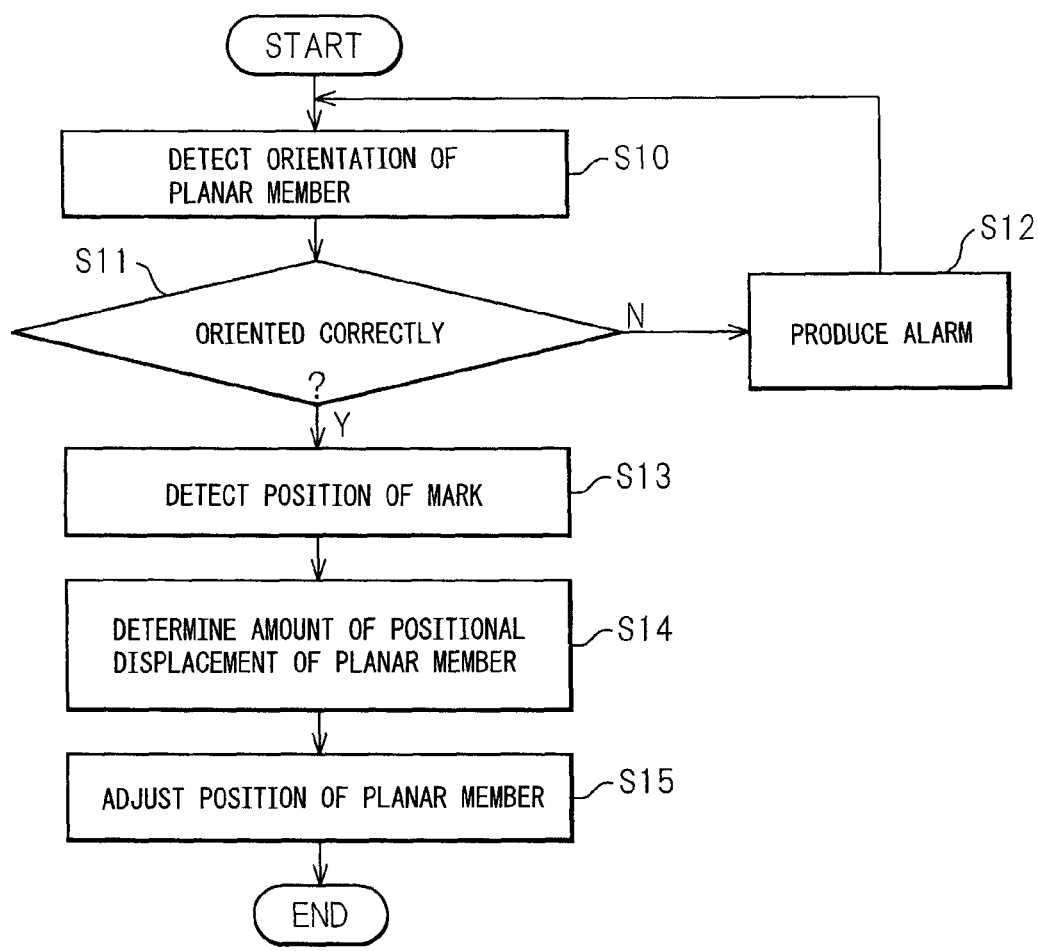
FIG. 3 is a flowchart illustrating a first example of an alignment method.

FIG. 3 is a flowchart illustrating a first example of an alignment method. In step S10, the image capturing unit 11 captures the image of the alignment mark M arranged on the planar member 2 in FIG. 1, and the orientation detection unit 14 detects the orientation of the planar member 2 by detecting the orientation of the image of the alignment mark M1.

In step S11, the determining unit 15 determines whether the planar member 2 is oriented in the correct direction by referring to the orientation detected by the orientation detection unit 14. If the planar member 2 is not oriented in the correct direction, the determining unit 15 produces an alarm in step S12. Then, the process returns to step S10.

If the planar member 2 is oriented in the correct direction, then in step S13 the position detection unit 12 detects the position of the alignment mark M in the image captured by the image capturing unit 11. After that, the position detection unit 12 determines the absolute position of the alignment mark M from a known absolute position in the field of view of the image capturing unit 11.

In step S14, based on the position of the alignment mark M detected by the position detection unit 12, the position adjusting unit 13 determines the amount of positional displacement between the planar member 2 and the reference position. In step S15, the position adjusting unit 13 adjusts the position of the planar member 2 relative to the reference position by moving the planar member 2 relative to the reference position.

Figure 4A:
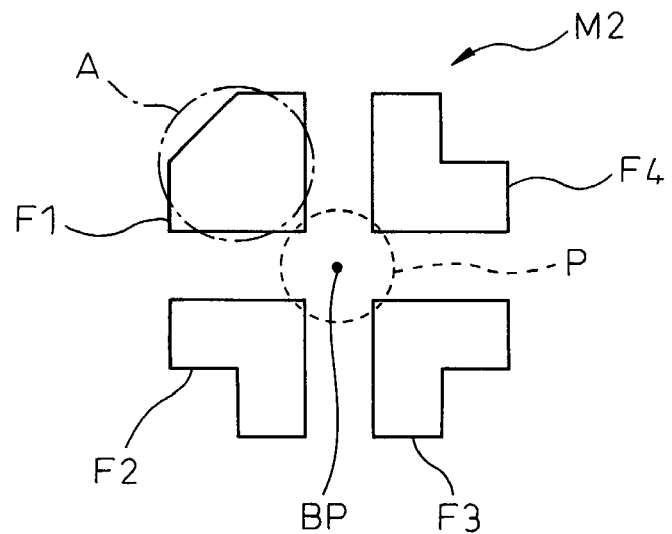
FIG. 4A is a diagram illustrating a second example of the alignment mark.

FIG. 4A is a diagram illustrating a second example of the alignment mark. The alignment mark M2 includes a collection of geometric figures F1 to F4, and each of these geometric figures F1 to F4 is placed in one of four quadrants centered about a base point BP taken as the origin. As illustrated, the geometric figures F2 to F4 are identical in shape, each rotated 90 degrees relative to one another, but the geometric figure F1 differs in shape from the geometric figures F2 to F4; as a result, the alignment mark M2 as a whole has a rotationally asymmetrical shape.

As in the case of the alignment mark M1 illustrated in FIG. 2, the position detection unit 12 detects the position of the alignment mark M2 by detecting, through image processing, the position of the portion of the alignment mark M2 indicated at reference character P. Further, the orientation of the planar member 2 can be detected by detecting the direction in which the portion indicated at reference character A is oriented in the image of the alignment mark M2 captured by the image capturing unit 11.

Figure 5:
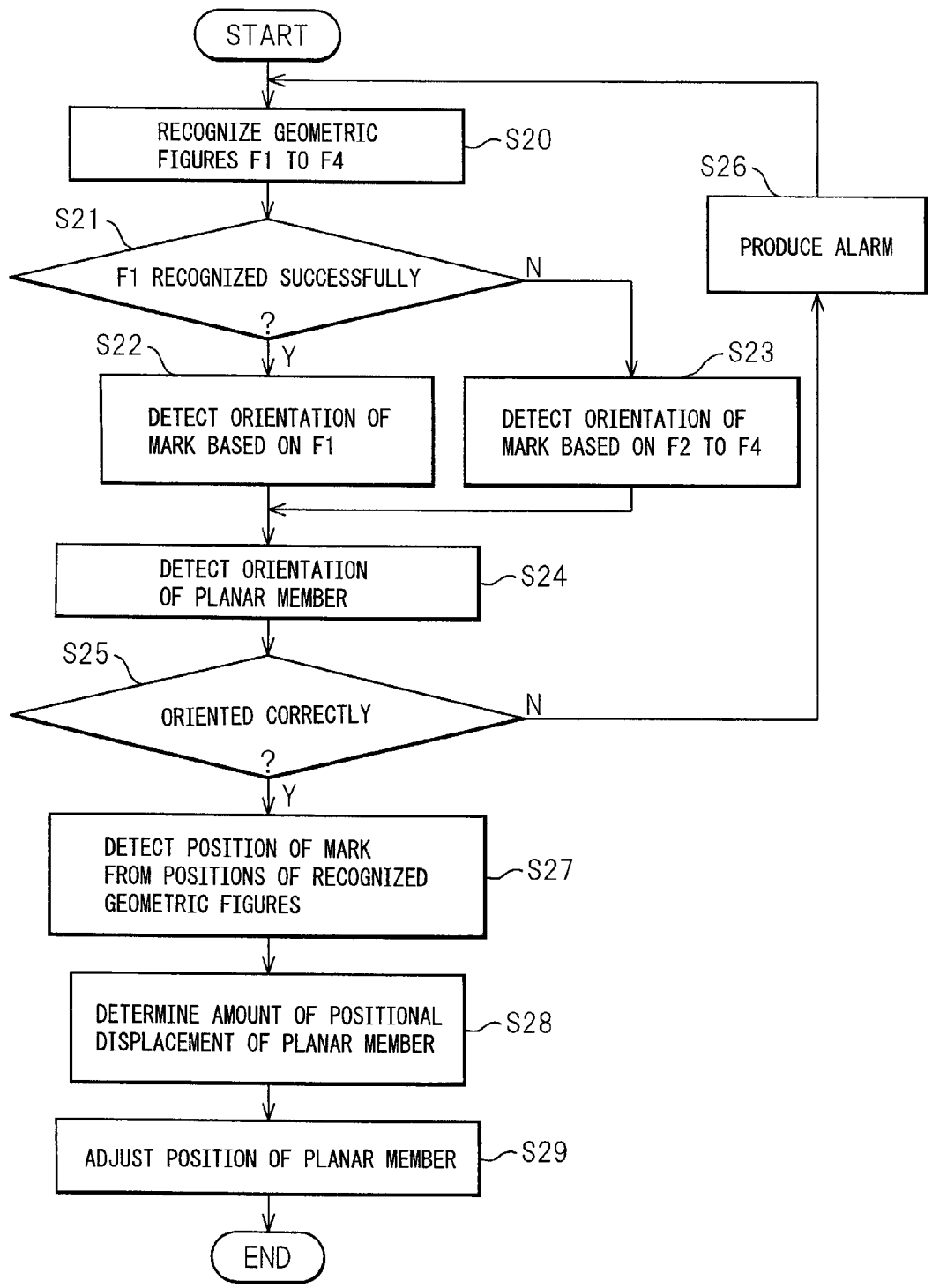
FIG. 5 is a flowchart illustrating a second example of an alignment method.

FIG. 5 is a flowchart illustrating an alignment method that uses the alignment mark M2 illustrated in FIG. 4A. In step S20, the image capturing unit 11 captures the image of the alignment mark M2 arranged on the planar member 2. The orientation detection unit 14 recognizes the geometric figures F1 to F4 of the alignment mark M2 by pattern matching.

In step S21, the orientation detection unit 14 determines whether the geometric figure F1 has been successfully recognized or not; if the geometric figure F1 has been successfully recognized, then in step S22 the orientation detection unit 14 detects the orientation of the alignment mark M2 based on the result of the recognition of the geometric figure F1. For example, if the geometric figure F1 is rotationally asymmetrical in shape, the orientation of the geometric figure F1 is detected in pattern matching and, based on the result of the detection, the orientation of the alignment mark M2 is detected. If the geometric figure F1 itself is not rotationally asymmetrical in shape, the orientation of the alignment mark M2 is detected based on the positional relationship of the geometric figure F1 relative to two of the other geometric figures F2 to F4.

If the geometric figure F1 has failed to be recognized, then in step S23 the orientation detection unit 14 detects the orientation of the alignment mark M2 based on the positional relationship between the other geometric figures F2 to F4. Since the positional relationship between the geometric figures F2 to F4 arranged in three quadrants varies depending on the orientation of the planar member 2, if the geometric figure F1 fails to be recognized, the orientation of the planar member 2 can be detected based on the positional relationship between the geometric figures F2 to F4.

In step S24, based on the result of the detection of the alignment mark M2 in step S22 or S23, the orientation detection unit 14 detects the orientation of the planar member 2. In step S25, the determining unit 15 determines whether the planar member 2 is oriented in the correct direction by referring to the orientation detected by the orientation detection unit 14. If the planar member 2 is not oriented in the correct direction, the determining unit 15 produces an alarm in step S26. Then, the process returns to step S20.

Figure 4B:
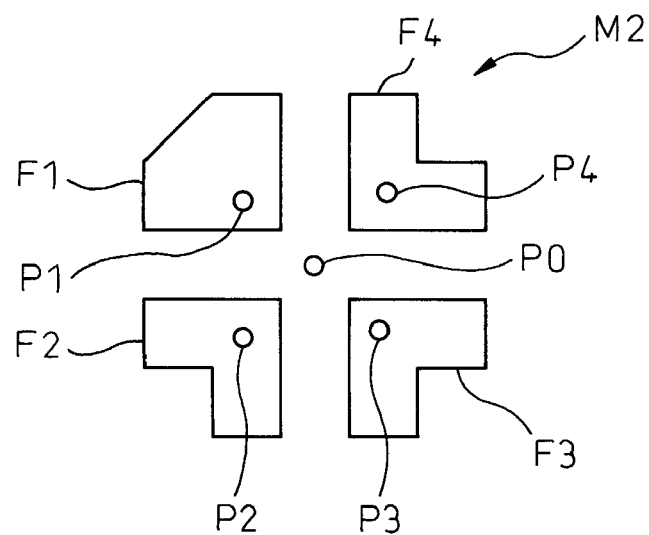
FIG. 4B is a diagram illustrating how position is determined using the alignment mark depicted in FIG. 4A.

In step S27, the position detection unit 12 detects the position of the alignment mark M2 in the image captured by the image capturing unit 11. FIG. 4B is a diagram illustrating how the position is determined using the alignment mark depicted in FIG. 4A.

The distances and directions from the position P0 indicated by the alignment mark M2 itself to the positions P1 to P4 of the geometric figures F1 to F4 contained in the alignment mark M2 are determined in advance from the setting data of the alignment mark M2 and stored as distance/direction data in a memory not depicted. Based on the stored distance/direction data, the position detection unit 12 determines the tentative position of the alignment mark M2 from each of the positions P1 to P4 of the geometric figures F1 to F4 successfully recognized in the captured image, and determines their average value as the position of the alignment mark M2. If any one of the tentative positions obtained from the respective positions P1 to P4 of the geometric figures F1 to F4 is displaced from a specified value by more than a threshold value, the average value may be calculated by excluding any such tentative position. After that, the position detection unit 12 determines the absolute position of the alignment mark M2 from a known absolute position in the field of view of the image capturing unit 11.

In step S28, based on the position of the alignment mark M2 detected by the position detection unit 12, the position adjusting unit 13 determines the amount of positional displacement between the planar member 2 and the reference position. In step S29, the position adjusting unit 13 adjusts the position of the planar member 2 relative to the reference position by moving the planar member 2 relative to the reference position.

Figure 6A:
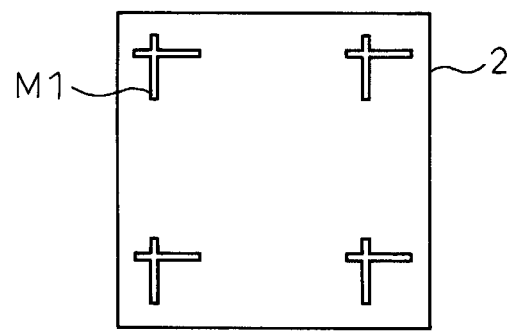
FIG. 6A is a diagram illustrating an example of how the mark depicted in FIG. 2 is arranged on a planar member.

FIG. 6A is a diagram illustrating an example of how the mark M1 depicted in FIG. 2 is arranged on the planar member 2. The example of the planar member 2 illustrated in FIG. 6A is square in shape with substantially equal vertical and horizontal dimensions. Accordingly, there are three possible cases where the planar member 2 is oriented in a wrong direction: rotated 180 degrees; rotated clockwise 90 degrees; and rotated counterclockwise 90 degrees.

Figure 6B:
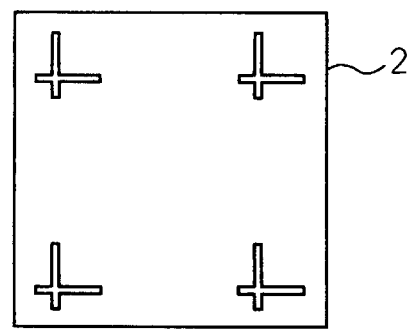
FIG. 6B is a diagram illustrating the condition in which the planar member depicted in FIG. 6A is rotated counterclockwise through 90 degrees.
Figure 6C:
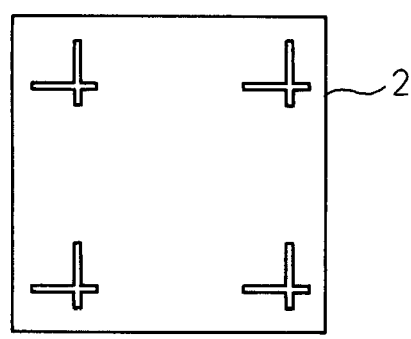
FIG. 6C is a diagram illustrating the condition in which the planar member depicted in FIG. 6A is rotated through 180 degrees.
Figure 6D:
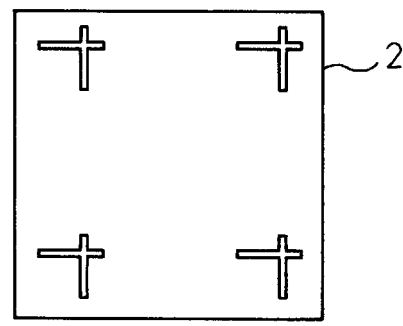
FIG. 6D is a diagram illustrating the condition in which the planar member depicted in FIG. 6A is rotated clockwise through 90 degrees.

FIG. 6B illustrates the condition in which the planar member 2 depicted in FIG. 6A is rotated counterclockwise 90 degrees, FIG. 6C illustrates the condition in which the planar member 2 depicted in FIG. 6A is rotated 180 degrees, and FIG. 6D illustrates the condition in which the planar member 2 depicted in FIG. 6A is rotated clockwise through 90 degrees.

Since the mark M1 has a rotationally asymmetrical shape as described earlier, the orientation of the mark M1 differs among the cases of FIG. 6A to FIG. 6D, thus making it possible to identify in which direction the planar member 2 is oriented. The same applies for the mark M2 depicted in FIG. 4A.

FIG. 7 is a diagram illustrating the line symmetry of the alignment mark M1 depicted in FIG. 2. The alignment mark M1 is asymmetrical about the X and Y axes but symmetrical about a line L as illustrated.

As a result, if the alignment mark M1 can be seen from below the planar member 2 because, for example, the planar member 2 is transparent, the orientation of the planar member 2 may not be identified.

Figure 6E:
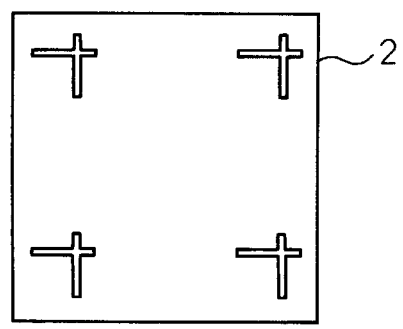
FIG. 6E is a diagram illustrating the condition in which the planar member depicted in FIG. 6A is turned over.
Figure 6F:
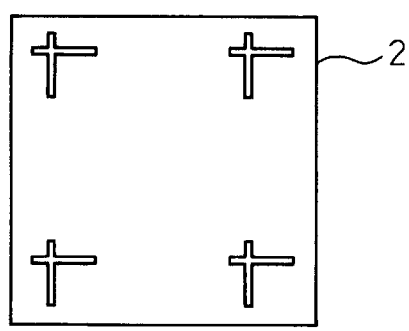
FIG. 6F is a diagram illustrating the condition in which the planar member in the condition depicted in FIG. 6E is rotated counterclockwise through 90 degrees.
Figure 6G:
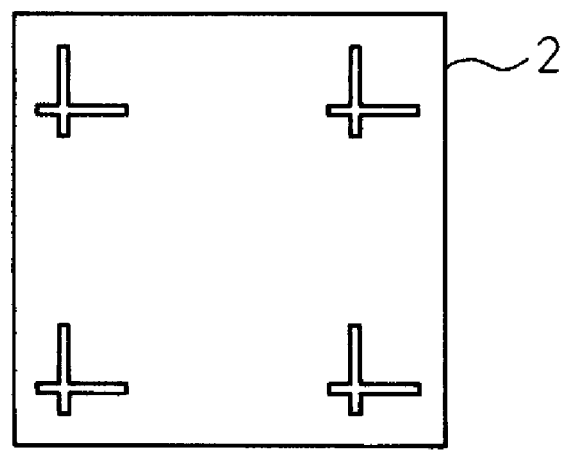
FIG. 6G is a diagram illustrating the condition in which the planar member in the condition depicted in FIG. 6E is rotated through 180 degrees.
Figure 6H:
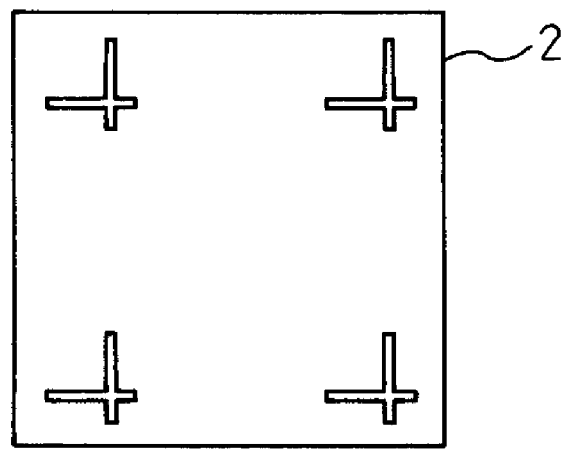
FIG. 6H is a diagram illustrating the condition in which the planar member in the condition depicted in FIG. 6E is rotated clockwise through 90 degrees.

FIG. 6E illustrates the condition in which the planar member depicted in FIG. 6A is turned over, FIG. 6F illustrates the condition in which the planar member in the condition depicted in FIG. 6E is rotated counterclockwise 90 degrees, FIG. 6G illustrates the condition in which the planar member in the condition depicted in FIG. 6E is rotated 180 degrees, and FIG. 6H illustrates the condition in which the planar member in the condition depicted in FIG. 6E is rotated clockwise 90 degrees.

Since the orientation of the alignment mark M1 is the same between FIG. 6A and FIG. 6F, between FIG. 6B and FIG. 6G, between FIG. 6C and FIG. 6H, and between FIG. 6D and FIG. 6E, respectively, it is not possible to discriminate between the respective conditions.

Figure 8A:
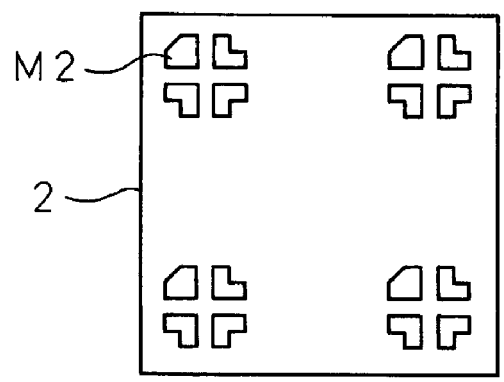
FIG. 8A is a diagram illustrating an example of how the alignment mark depicted in FIG. 4A is arranged.
Figure 8B:
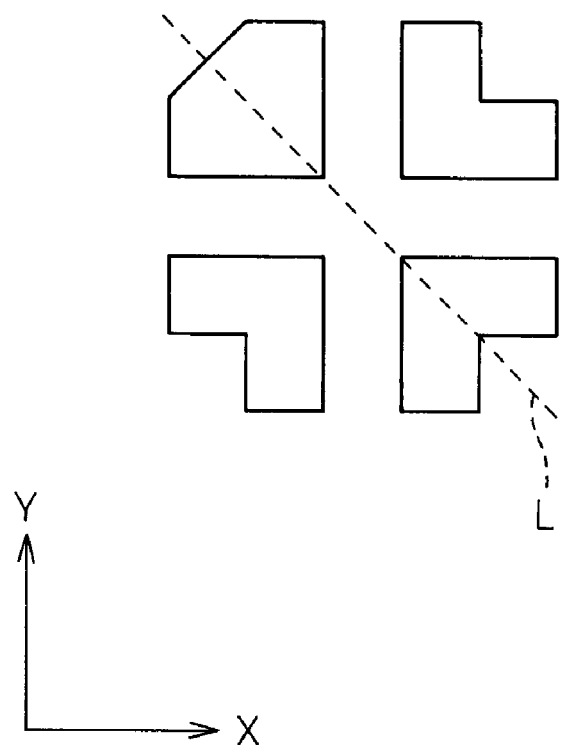
FIG. 8B is a diagram illustrating the line symmetry of the alignment mark depicted in FIG. 4A.

FIG. 8A is a diagram illustrating an example of how the alignment mark M2 depicted in FIG. 4A is arranged on the planar member 2, and FIG. 8B is a diagram illustrating the line symmetry of the alignment mark depicted in FIG. 4A. The alignment mark M2 also is asymmetrical about the X and Y axes but symmetrical about a line L as illustrated.

As a result, as in the case of the alignment mark M1 described with reference to FIG. 6A to FIG. 6H and FIG. 7, if the alignment mark M2 can be seen from below the planar member 2, the orientation of the planar member 2 may not be identified.

Figure 9A:
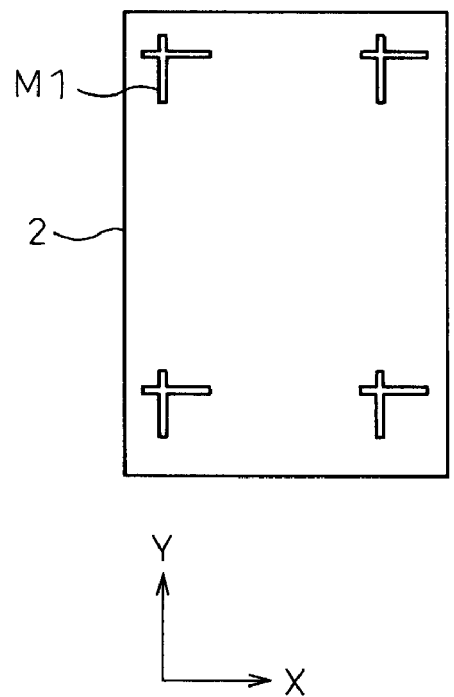
FIG. 9A is a diagram illustrating an example of how the alignment mark depicted in FIG. 2 is arranged on a planar member of a rectangular shape.
Figure 9B:
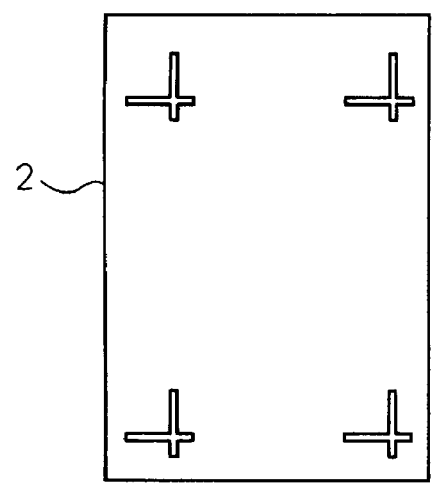
FIG. 9B is a diagram illustrating the condition in which the planar member depicted in FIG. 9A is rotated through 180 degrees.
Figure 9C:
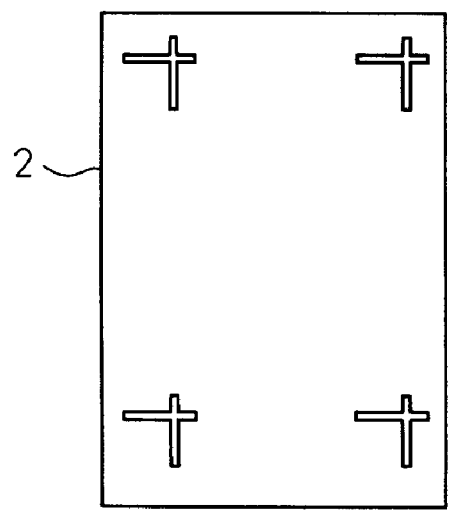
FIG. 9C is a diagram illustrating the condition in which the planar member depicted in FIG. 9A is turned over.
Figure 9D:
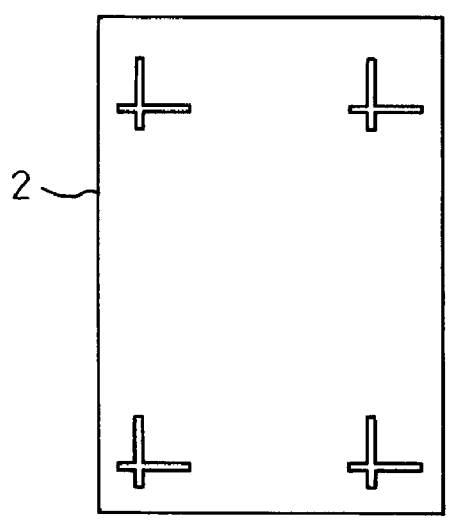
FIG. 9D is a diagram illustrating the condition in which the planar member in the condition depicted in FIG. 9C is rotated 180 degrees.

FIG. 9A is a diagram illustrating an example of how the alignment mark M1 depicted in FIG. 2 is arranged on a planar member of a rectangular shape. FIG. 9B illustrates the condition in which the planar member depicted in FIG. 9A is rotated through 180 degrees, FIG. 9C illustrates the condition in which the planar member depicted in FIG. 9A is turned over, and FIG. 9D illustrates the condition in which the planar member in the condition depicted in FIG. 9C is rotated 180 degrees.

When the vertical and horizontal dimensions of the planar member 2 are unequal, it is hard to imagine that the planar member would be placed erroneously by being rotated 90 degrees; therefore, the only possible case where the planar member 2 is oriented in a wrong direction is the case where it is rotated 180 degrees.

Accordingly, even if the alignment mark M1 can be seen from below the planar member 2, the orientation of the mark M1 is different in different cases as depicted in FIG. 9A to FIG. 9D, thus making it possible to identify in which direction the planar member 2 is oriented. The same applies for the alignment mark M2 depicted in FIG. 4A.

Figure 10A:
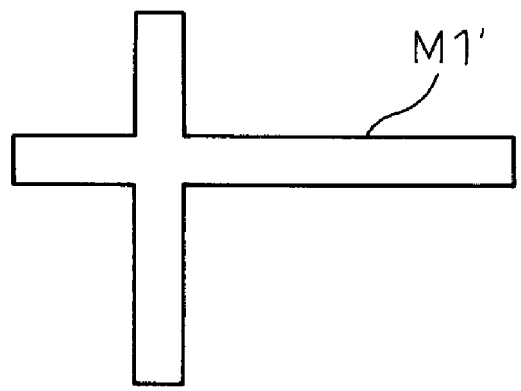
FIG. 10A is a diagram illustrating a modified example of the alignment mark depicted in FIG. 2.

FIG. 10A is a diagram illustrating a modified example of the alignment mark M1 depicted in FIG. 2. The alignment mark M1' whose shape is modified from that of the alignment mark M1 is rotationally asymmetrical and is line asymmetrical about any direction line.

Figure 10B:
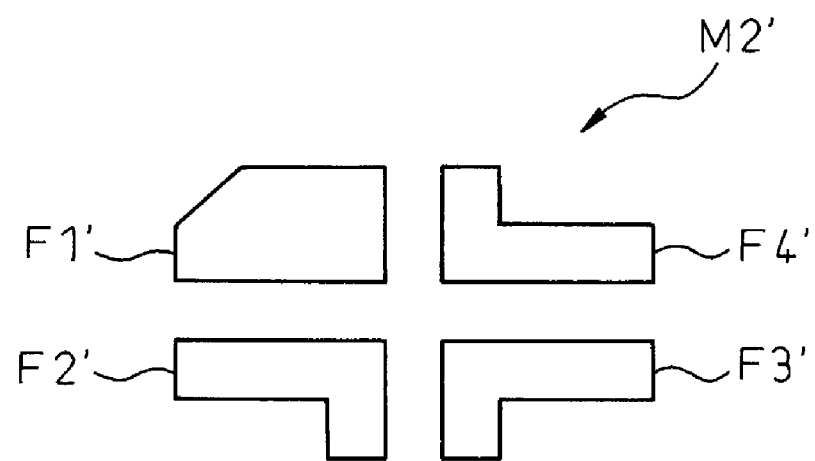
FIG. 10B is a diagram illustrating a modified example of the alignment mark depicted in FIG. 4A.

FIG. 10B is a diagram illustrating a modified example of the alignment mark M2 depicted in FIG. 4A. The alignment mark M2' whose shape is modified from that of the alignment mark M2 is rotationally asymmetrical and is line asymmetrical about any direction line. The geometric figure F1' formed by modifying the geometric figure F1 contained in the alignment mark M2 is also line asymmetrical about any direction line.

Figure 11A:
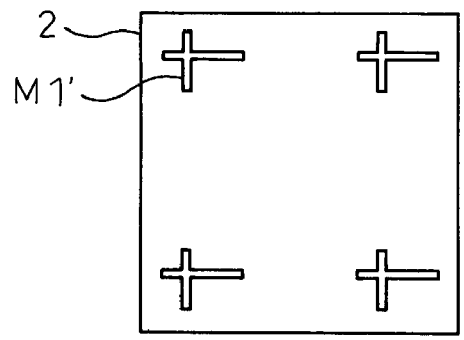
FIG. 11A is a diagram illustrating an example of how the alignment mark depicted in FIG. 10A is arranged on the planar member.
Figure 11B:
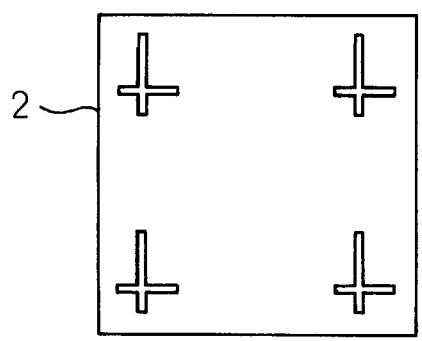
FIG. 11B is a diagram illustrating the condition in which the planar member depicted in FIG. 11A is rotated counterclockwise 90 degrees.
Figure 11C:
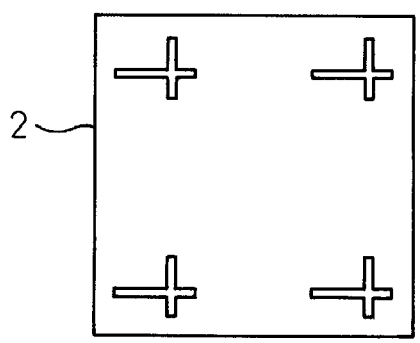
FIG. 11C is a diagram illustrating the condition in which the planar member depicted in FIG. 11A is rotated 180 degrees.
Figure 11D:
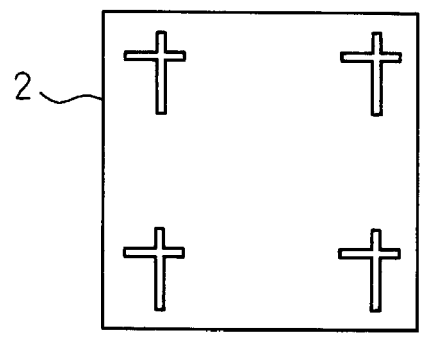
FIG. 11D is a diagram illustrating the condition in which the planar member depicted in FIG. 11A is rotated clockwise 90 degrees.
Figure 11E:
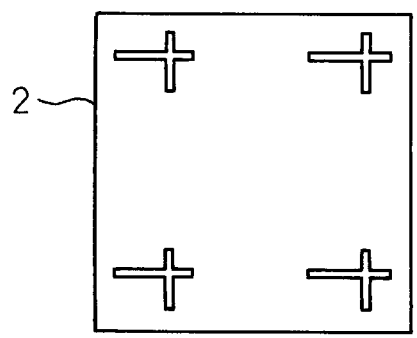
FIG. 11E is a diagram illustrating the condition in which the planar member depicted in FIG. 11A is turned over.
Figure 11F:
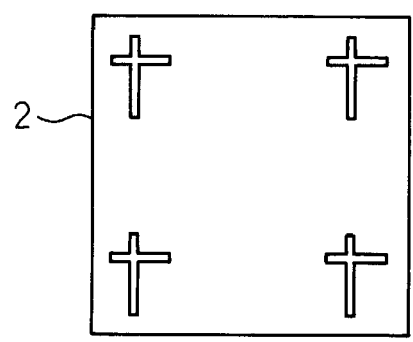
FIG. 11F is a diagram illustrating the condition in which the planar member in the condition depicted in FIG. 11E is rotated counterclockwise 90 degrees.
Figure 11G:
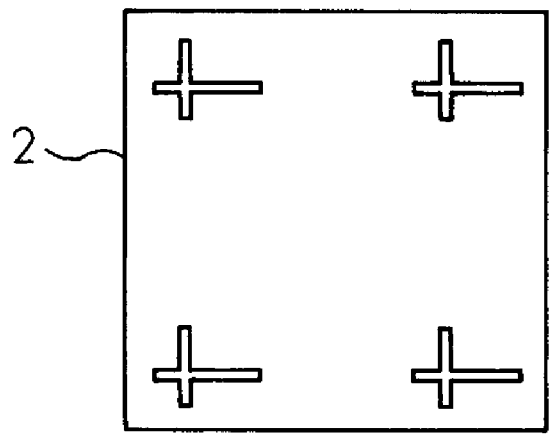
FIG. 11G is a diagram illustrating the condition in which the planar member in the condition depicted in FIG. 11E is rotated 180 degrees.
Figure 11H:
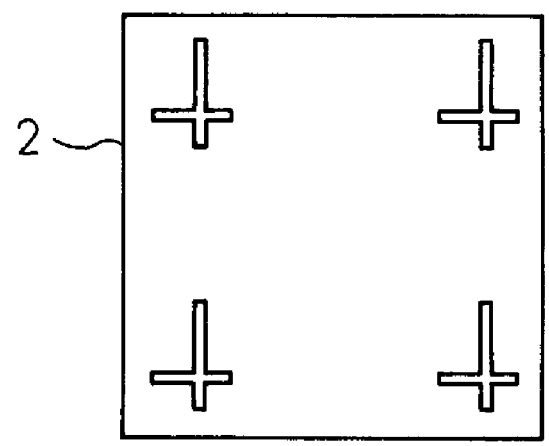
FIG. 11H is a diagram illustrating the condition in which the planar member in the condition depicted in FIG. 11E is rotated clockwise through 90 degrees.

FIG. 11A is a diagram illustrating an example of how the alignment mark M1' depicted in FIG. 10A is arranged on the planar member, FIG. 11B illustrates the condition in which the planar member depicted in FIG. 11A is rotated counterclockwise 90 degrees, FIG. 11C illustrates the condition in which the planar member depicted in FIG. 11A is rotated 180 degrees, FIG. 11D illustrates the condition in which the planar member depicted in FIG. 11A is rotated clockwise 90 degrees, FIG. 11E illustrates the condition in which the planar member depicted in FIG. 11A is turned over, FIG. 11F illustrates the condition in which the planar member in the condition depicted in FIG. 11E is rotated counterclockwise 90 degrees, FIG. 11G illustrates the condition in which the planar member in the condition depicted in FIG. 11E is rotated 180 degrees, and FIG. 11H illustrates the condition in which the planar member in the condition depicted in FIG. 11E is rotated clockwise 90 degrees.

As can be seen from FIG. 11A to FIG. 11H, the orientation of the alignment mark M1' is different in different cases.

Accordingly, even when there is the possibility that the planar member 2 may be placed erroneously by being rotated 180 degrees or by being rotated 90 degrees in a clockwise or counterclockwise direction, and when the alignment mark M1' can be seen from below the planar member 2, it is possible to identify in which direction the planar member 2 is oriented. The same applies for the alignment mark M2' depicted in FIG. 10B.

Figure 12A:
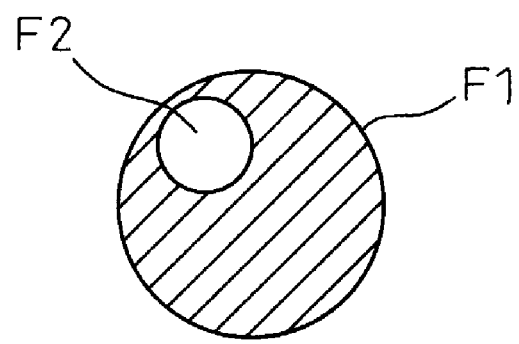
FIG. 12A is a diagram illustrating another example of the alignment mark.
Figure 12B:
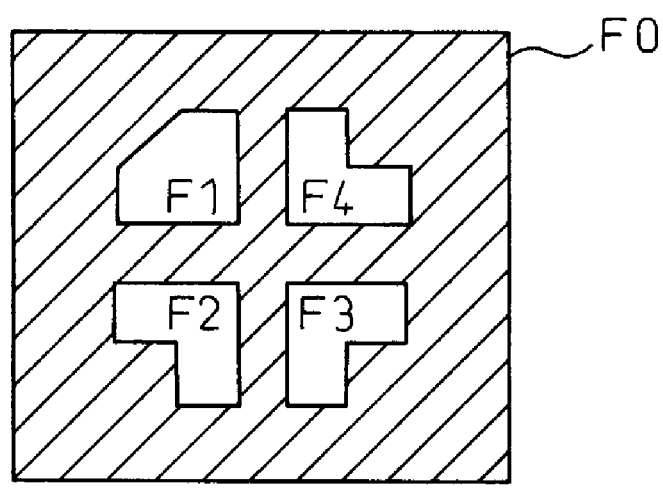
FIG. 12B is a diagram illustrating an alternative example of the alignment mark.

FIG. 12A and FIG. 12B are diagrams illustrating other examples of the alignment mark. The alignment mark may be formed in a rotationally asymmetrical shape by forming a circular geometric figure F1 and placing therein a smaller circular geometric figure F2, as depicted in FIG. 12A.

Alternatively, the rotationally asymmetrical alignment mark may be formed, as depicted in FIG. 12B, by placing within a rotationally symmetrical and line symmetrical geometric figure F0 a rotationally asymmetrical geometric figure formed from a collection of geometric figures F1 to F4. Further, the mark formed from the collection of the geometric figures F1 to F4 may be made, for example, not only rotationally asymmetrical but also line asymmetrical, thereby making the alignment mark as a whole not only rotationally asymmetrical but also line asymmetrical.

Figure 13:
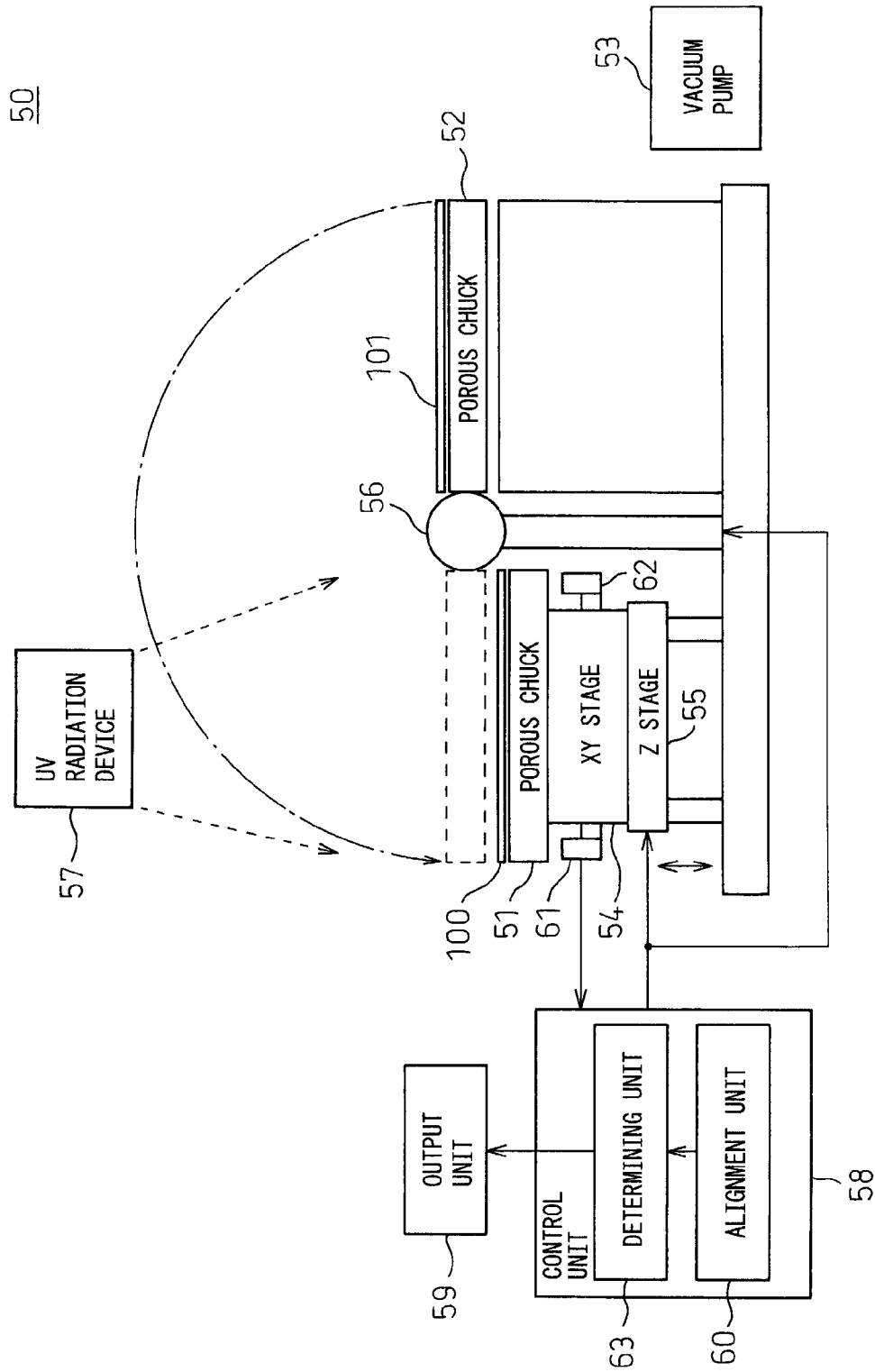
FIG. 13 is a diagram illustrating a first configuration example of a fabrication apparatus to which the alignment apparatus according to the embodiment is applied.

FIG. 13 is a diagram illustrating a first configuration example of a fabrication apparatus to which the alignment apparatus according to the embodiment is applied. The fabrication apparatus 50 is an apparatus for fabricating a component having a multilayer structure by laminating together two transparent sheets or glass-like plates such as liquid crystal, electronic paper, organic EL, or like members. In the description given hereinafter by referring to FIG. 13 and FIG. 14, the transparent sheets and the transparent plates may be collectively referred to as the "transparent sheets."

The fabrication apparatus 50 includes: porous chucks 51 and 52 for holding thereon first and second transparent sheets 100 and 101 as workpieces, respectively; a vacuum pump 53 for applying a negative pressure to the porous chucks 51 and 52; an XY stage 54 for moving the porous chuck 51 in two-dimensional space; a Z stage 55 for moving the XY stage 54 up and down; a rotary actuator 56 for turning the porous chuck 52 and placing it onto the porous chuck 51, thereby holding together the first and second transparent sheets 100 and 101 held on the porous chucks 51 and 52; and an ultraviolet (UV) radiation device 57 for curing a coating adhesive applied to the first and second transparent sheets 100 and 101 after laminating them together.

The fabrication apparatus 50 further includes: a control unit 58 as a computer or the like for controlling the fabrication apparatus 50; cameras 61 and 62; and an output unit 59 as a display device or printing device for outputting a message for an operator from the control unit 58 or for outputting images captured by the camera 61 and/or the camera 62.

The first and second transparent sheets 100 and 101 are provided with alignment marks such as described with reference to FIG. 2, FIG. 4A, FIG. 10A, FIG. 10B, FIG. 12A, FIG. 12B, etc., and the camera 61 and/or the camera 62 capture images of the alignment marks formed on the first transparent sheet 100 held on the porous chuck 51. When the porous chuck 52 is placed over the porous chuck 51, the camera 61 and/or the camera 62 capture images of the alignment marks formed on the second transparent sheet 101 held on the porous chuck 52.

The control unit 58 includes an alignment unit 60 and a determining unit 63 which are identical in function to the alignment apparatus 10 and the determining unit 15, respectively, described with reference to FIG. 1. The control unit 58 may implement the functions of the alignment unit 60 and the determining unit 63 by executing prescribed programs on a computer, or the alignment unit 60 and the determining unit 63 may each be implemented using dedicated hardware.

The alignment unit 60 takes as inputs the images that the camera 61 and/or the camera 62 captured of the alignment marks formed on the first and second transparent sheets 100 and 101 held on the porous chucks 51 and 52, aligns the first and second transparent sheets 100 and 101 relative to each other by moving the XY stage 54, and detects the orientations of the transparent sheets 100 and 101 held on the respective porous chucks 51 and 52.

Based on the orientations of the first and second transparent sheets 100 and 101 detected by the alignment unit 60, the determining unit 63 determines whether the first and second transparent sheets 100 and 101 held on the respective porous chucks 51 and 52 are oriented in the correct direction; if the first and second transparent sheets 100 and 101 are not oriented correctly, the determining unit 60 sends an alarm signal to the output unit 59.

When placing the transparent sheets one above the other or when processing the transparent sheets by $CO_2$ laser, since the transparent sheets are transparent and the electrode patterns written on the respective transparent sheets are translucent and not easily visible, there has been the problem that it is difficult for the operator to identify the orientation of each transparent sheet when placing the transparent sheets on the porous chucks 51 and 52.

According to the fabrication apparatus 50, the alignment unit 60 checks the orientation of each transparent sheet and, if the transparent sheet is not correctly oriented, an alarm indication is produced on the output unit 59; this spares the operator the trouble of checking the orientation and serves to improve work efficiency.

Figure 14:
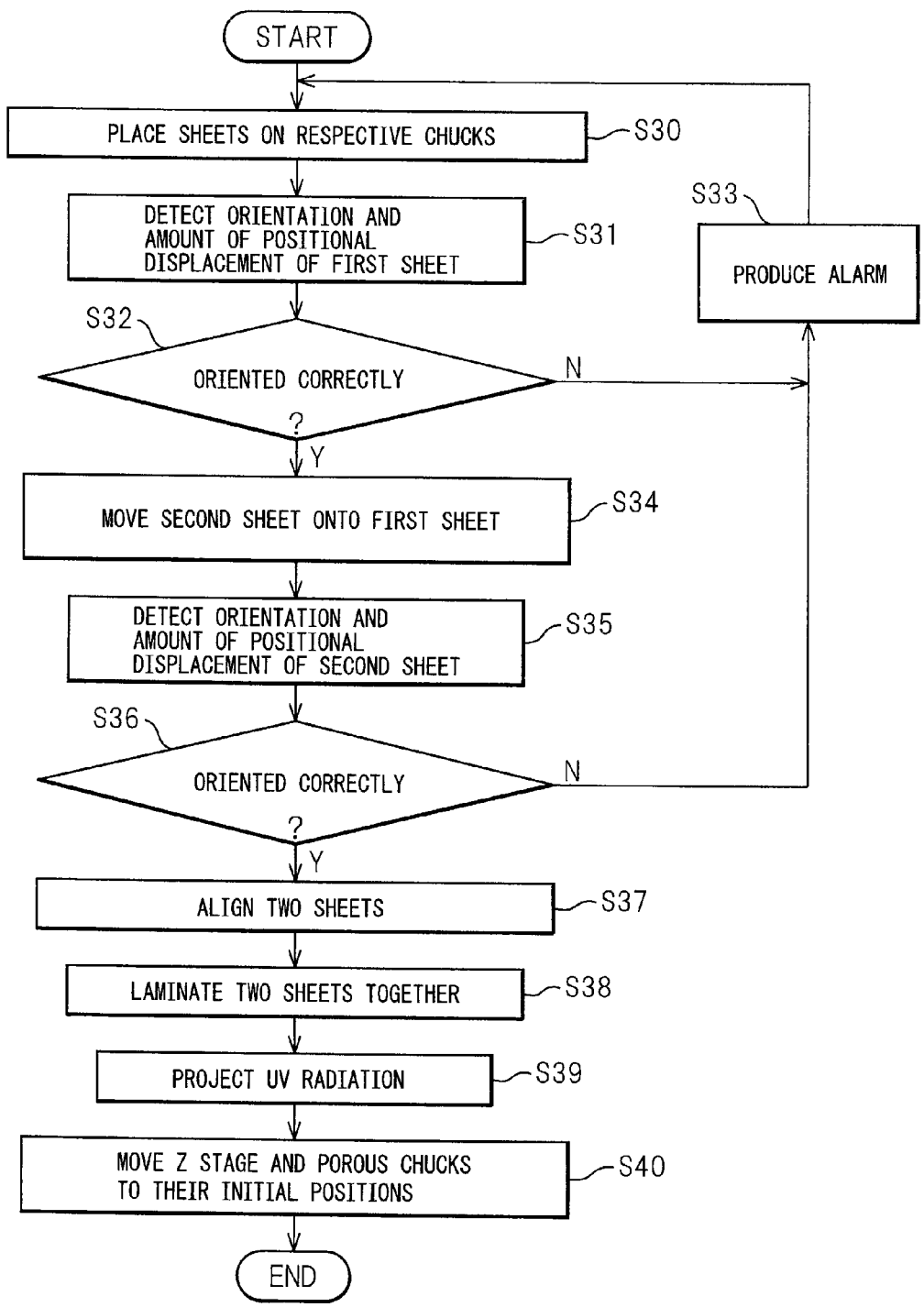
FIG. 14 is a flowchart of a fabrication method for use with the fabrication apparatus depicted in FIG. 13.

FIG. 14 is a flowchart of a fabrication method for use with the fabrication apparatus depicted in FIG. 13. In step S30, the operator places the first transparent sheet 100 on the porous chuck 51 and the second transparent sheet 101 on the porous chuck 52.

In step S31, the camera 61 and/or the camera 62 capture images of the alignment marks formed on the first transparent sheet 100 and, from the captured images, the alignment unit 60 detects the orientation of the first transparent sheet 100 and the amount of positional displacement of the first transparent sheet 100 relative to the reference position.

In step S32, the determining unit 63 determines whether the first transparent sheet 100 is oriented in the correct direction. If the first transparent sheet 100 is not oriented in the correct direction, the determining unit 63 in step S33 sends an alarm signal to the output unit 59, urging the operator to reorient the first transparent sheet 100 correctly. Thereafter, the process returns to step S30.

If the first transparent sheet 100 is oriented in the correct direction, then in step S34 the rotary actuator 56 is turned to move the second transparent sheet 101 onto the first transparent sheet 100.

In step S35, the Z stage 55 is moved upward to move the cameras 61 and 62 mounted on the XY stage 54 and the first transparent sheet 100 closer to the second transparent sheet 101 so that the alignment marks provided on the first and second transparent sheets 100 and 101 are brought into the depth of field of the cameras 61 and 62. Then, images of the alignment marks formed on the second transparent sheet 101 are captured and, from the captured images, the alignment unit 60 detects the orientation of the second transparent sheet 101 and the amount of positional displacement of the second transparent sheet 101 relative to the reference position.

In this case, if the alignment marks provided on the first transparent sheet 100 overlap the alignment marks provided on the second transparent sheet 101 and obstruct the viewing of the alignment marks provided on the second transparent sheet 101, the XY stage 54 is driven to reposition the first transparent sheet 100 so that the alignment marks provided on the first transparent sheet 100 do not overlap the alignment marks provided on the second transparent sheet 101.

In step S36, the determining unit 63 determines whether the second transparent sheet 101 is oriented in the correct direction. If the second transparent sheet 101 is not oriented in the correct direction, the determining unit 63 in step S33 sends an alarm signal to the output unit 59, urging the operator to reorient the second transparent sheet 101 correctly. Thereafter, the process returns to step S30.

In step S37, from the amounts of positional displacement of the first and second transparent sheets 100 and 101, the alignment unit 60 determines the amount of positional displacement between the first and second transparent sheets 100 and 101. Then, the alignment unit 60 aligns the first and second transparent sheets 100 and 101 to each other by moving the XY stage 54 so as to reduce the thus determined amount of positional displacement to zero.

In step S38, the Z stage 55 is moved upward, and the first and second transparent sheets 100 and 101 are laminated together under pressure.

In step S39, the UV radiation device 57 projects ultraviolet radiation onto the first and second transparent sheets 100 and 101, thereby curing the coating adhesive on the respective sheets 100 and 101 and preventing them from slipping out of position.

In step S40, after stopping the vacuum clamping to the porous chuck 101, the Z stage 55 and the porous chuck 101 are moved back to their initial positions.

Figure 15:
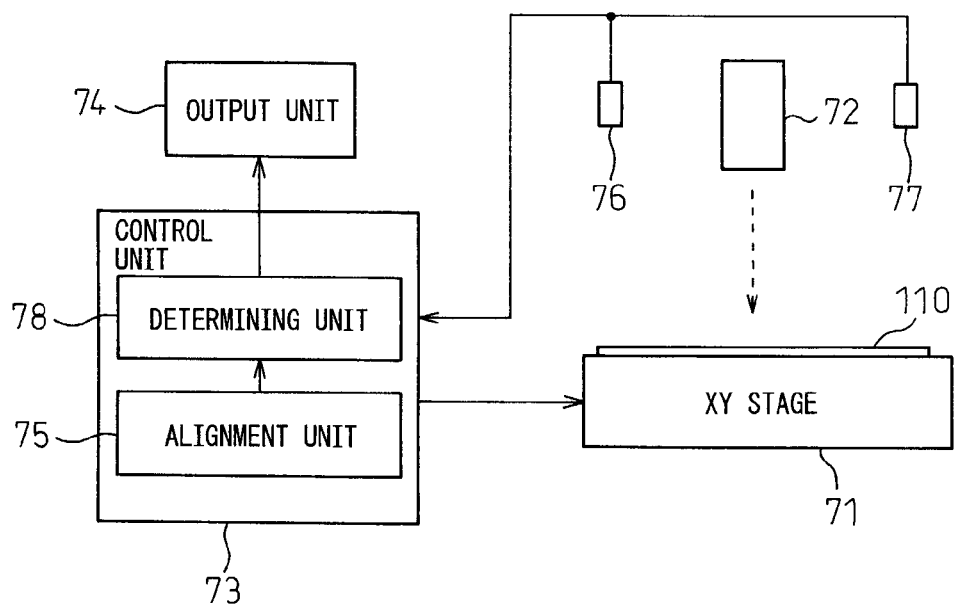
FIG. 15 is a diagram illustrating a second configuration example of a fabrication apparatus to which the alignment apparatus according to the embodiment is applied.

FIG. 15 is a diagram illustrating a second configuration example of a fabrication apparatus to which the alignment apparatus according to the embodiment is applied. The fabrication apparatus 70 is a fabrication apparatus for fabricating a transparent planar component by applying laser to two transparent sheets or glass-like plates such as liquid crystal, electronic paper, organic EL, or like members, or a fabrication apparatus for fabricating a circuit substrate by drilling holes in the substrate by laser. In the description given hereinafter by referring to FIG. 15 and FIG. 16, the transparent sheets and the transparent plates and substrates may be collectively referred to as the "substrates."

The fabrication apparatus 70 includes: an XY stage 71 for mounting thereon a substrate 110 and for moving the substrate 110 in two-dimensional space; a laser light source 72 for generating laser light for processing the substrate 110 by laser; a control unit 73 as a computer or the like for controlling the fabrication apparatus 70; cameras 76 and 77; and an output unit 74 as a display device or printing device for outputting a message for an operator from the control unit 73 or for outputting images captured by the camera 76 and/or the camera 77.

The substrate 110 is provided with alignment marks such as described with reference to FIG. 2, FIG. 4A, FIG. 10A, FIG. 10B, FIG. 12A, FIG. 12B, etc., and the camera 76 and/or the camera 77 capture images of the alignment marks formed on the substrate 110 mounted on the XY stage 71.

The control unit 73 includes an alignment unit 75 and a determining unit 78 which are identical in function to the alignment apparatus 10 and the determining unit 15, respectively, described with reference to FIG. 1. The control unit 73 may implement the functions of the alignment unit 75 and the determining unit 78 by executing prescribed programs on a computer, or the alignment unit 75 and the determining unit 78 may each be implemented using dedicated hardware.

The alignment unit 75 takes as inputs the images that the camera 76 and/or the camera 77 captured of the alignment marks formed on the substrate 110, aligns the substrate 110 with respect to the laser light source 72 by moving the XY stage 71, and detects the orientation of the substrate 110. The position of the substrate 110 relative to the laser light source 72 may be adjusted by moving the laser light source 72 instead of or in addition to moving the substrate 110 by the XY stage 71.

Based on the orientation of the substrate 110 detected by the alignment unit 75, the determining unit 78 determines whether the substrate 110 mounted on the XY stage 71 is oriented in the correct direction; if the substrate 110 is not oriented correctly, the determining unit 78 sends an alarm signal to the output unit 74.

Figure 16:
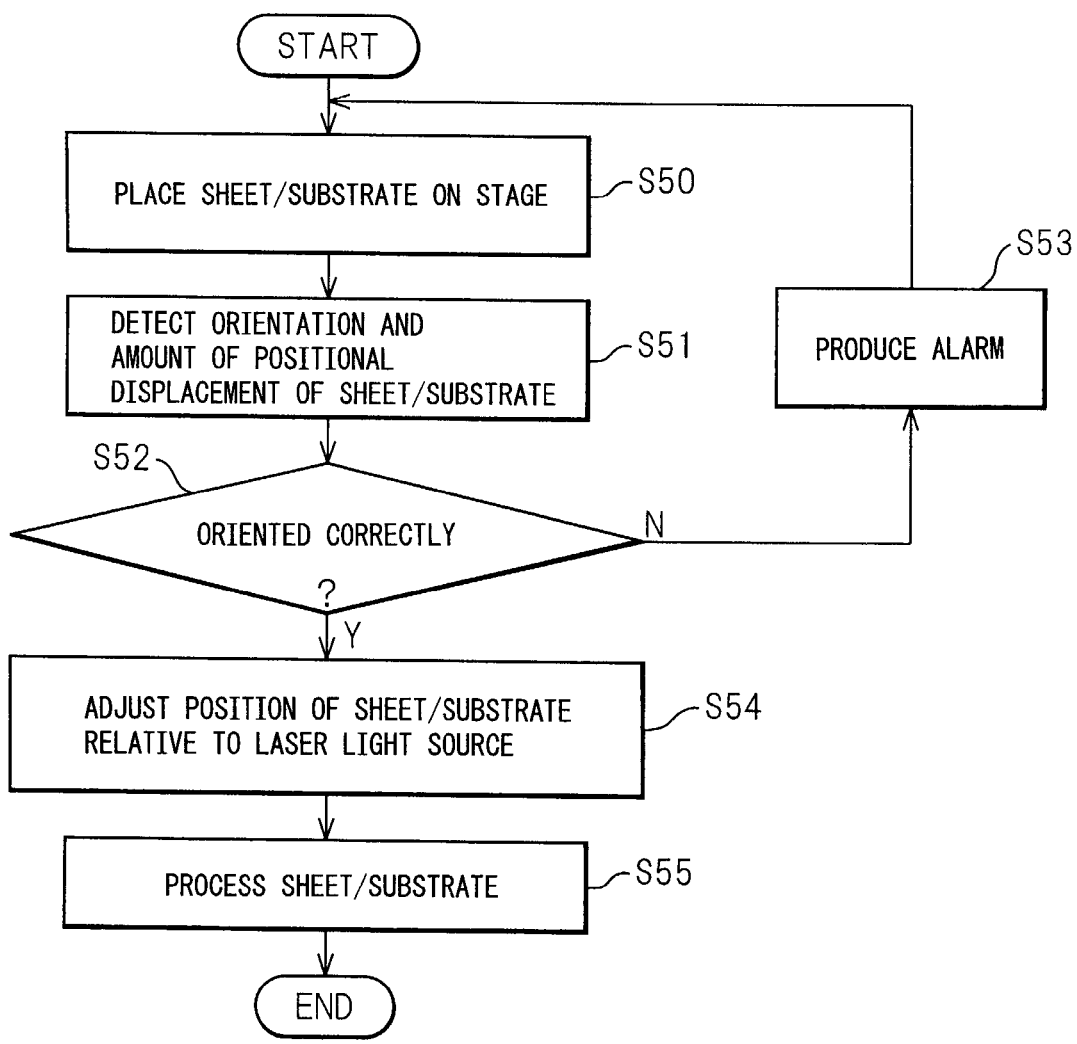
FIG. 16 is a flowchart of a fabrication method for use with the fabrication apparatus depicted in FIG. 15.

FIG. 16 is a flowchart of a fabrication method for use with the fabrication apparatus depicted in FIG. 15. In step S50, the operator places the substrate 110 on the XY stage 71.

In step S51, the camera 76 and/or the camera 77 capture images of the alignment marks formed on the substrate 110 and, from the captured images, the alignment unit 75 detects the orientation of the substrate 110 and the amount of positional displacement of the substrate 110 relative to the reference position.

In step S52, the determining unit 78 determines whether the substrate 110 is oriented in the correct direction. If the substrate 110 is not oriented in the correct direction, the determining unit 78 in step S53 sends an alarm signal to the output unit 74, urging the operator to reorient the substrate 110 correctly. Thereafter, the process returns to step S50.

If the substrate 110 is oriented in the correct direction, then in step S54 the substrate 110 is aligned relative to the laser light source 72 by moving the XY stage 71 or the laser light source 72 so as to reduce the amount of positional displacement of the substrate 110 to zero.

In step S55, the substrate 110 is processed by applying laser light from the laser light source 72.

Figure 17:
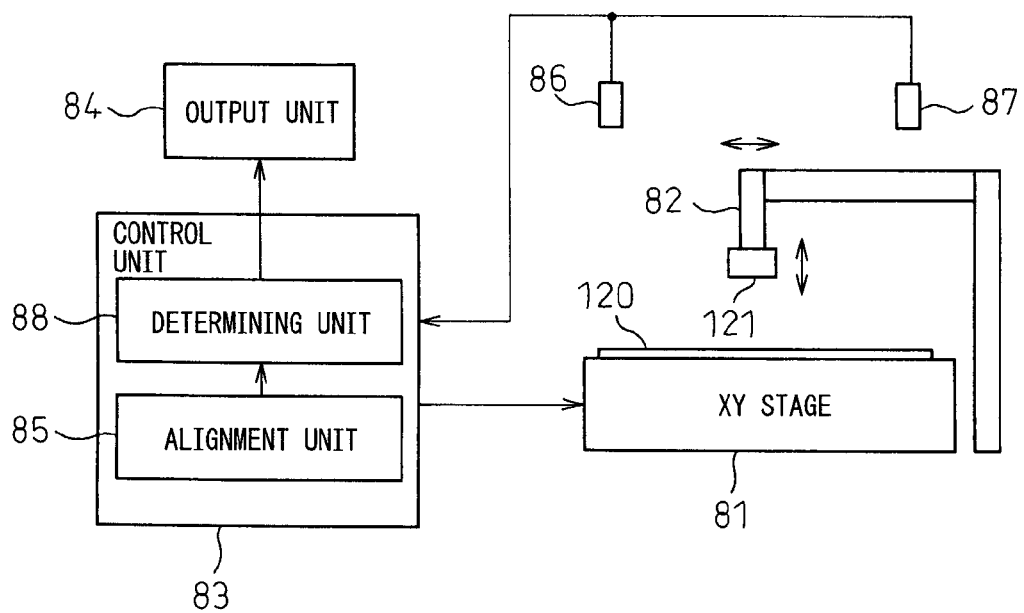
FIG. 17 is a diagram illustrating a third configuration example of a fabrication apparatus to which the alignment apparatus according to the embodiment is applied.

FIG. 17 is a diagram illustrating a third configuration example of a fabrication apparatus to which the alignment apparatus according to the embodiment is applied. The fabrication apparatus 80 is a fabrication apparatus for fabricating a circuit substrate by mounting an electronic component 121 on the substrate 120.

The fabrication apparatus 80 includes: an XY stage 81 for mounting thereon the substrate 120 as a workpiece and for moving the substrate 120 in two-dimensional space; a mounting head 82 for transferring and mounting the electronic component 121 onto the substrate 120; a control unit 83 as a computer or the like for controlling the fabrication apparatus 80; cameras 86 and 87; and an output unit 84 as a display device or printing device for outputting a message for an operator from the control unit 83 or for outputting images captured by the camera 86 and/or the camera 87.

The substrate 120 is provided with alignment marks such as described with reference to FIG. 2, FIG. 4A, FIG. 10A, FIG. 10B, FIG. 12A, FIG. 12B, etc., and the camera 86 and/or the camera 87 capture images of the alignment marks formed on the substrate 120 mounted on the XY stage 81.

The control unit 83 includes an alignment unit 85 and a determining unit 88 which are identical in function to the alignment apparatus 10 and the determining unit 15, respectively, described with reference to FIG. 1. The control unit 83 may implement the functions of the alignment unit 85 and the determining unit 88 by executing prescribed programs on a computer, or the alignment unit 85 and the determining unit 88 may each be implemented using dedicated hardware.

The alignment unit 85 takes as inputs the images that the camera 86 and/or the camera 87 captured of the alignment marks formed on the substrate 120, aligns the substrate 120 with respect to the mounting head 82 by moving the XY stage 81, and detects the orientation of the substrate 120. The position of the substrate 120 relative to the mounting head 82 may be adjusted by moving the mounting head 82 instead of or in addition to moving the substrate 120 by the XY stage 81.

Based on the orientation of the substrate 120 detected by the alignment unit 85, the determining unit 88 determines whether the substrate 120 mounted on the XY stage 81 is oriented in the correct direction; if the substrate 120 is not oriented correctly, the determining unit 88 sends an alarm signal to the output unit 84.

Figure 18:
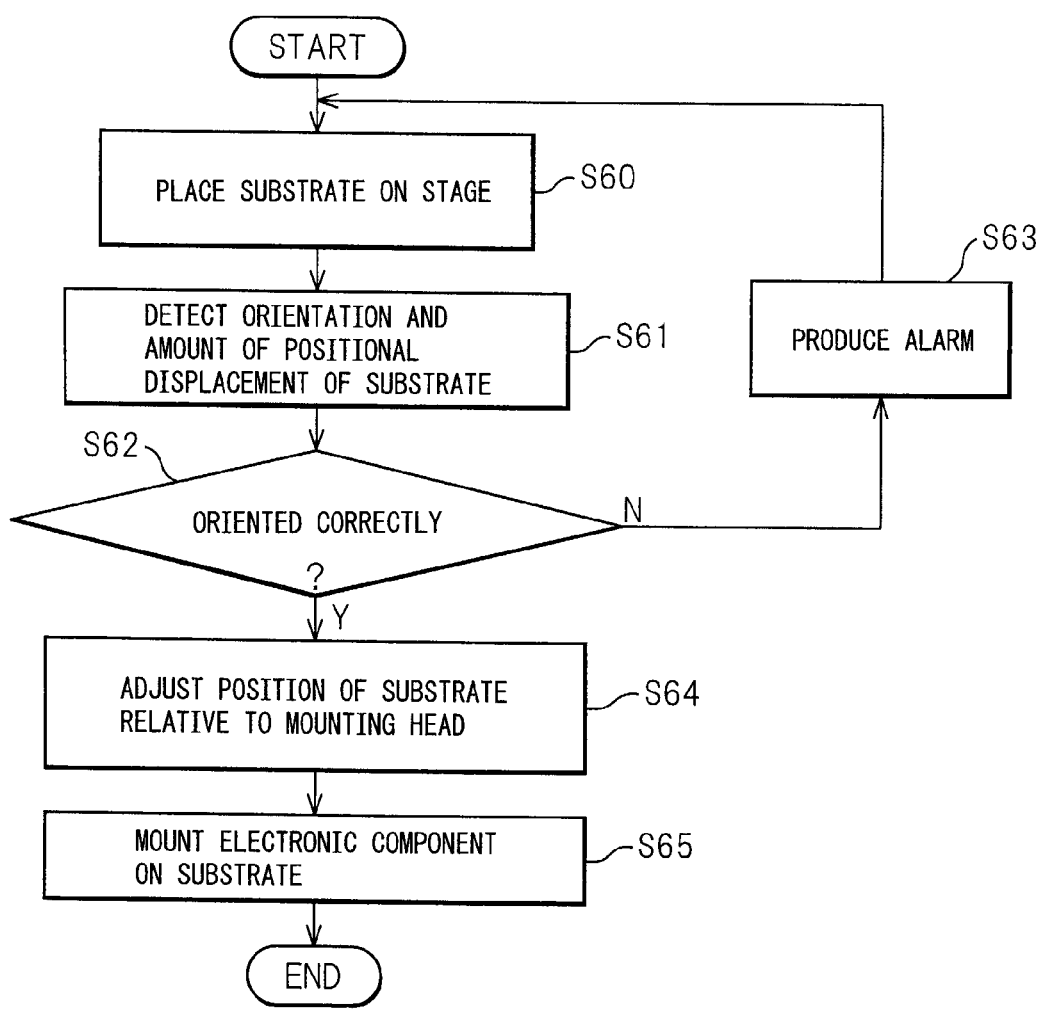
FIG. 18 is a flowchart of a fabrication method for use with the fabrication apparatus depicted in FIG. 17.

FIG. 18 is a flowchart of a fabrication method for use with the fabrication apparatus depicted in FIG. 17. In step S60, the operator places the substrate 120 on the XY stage 81.

In step S61, the camera 86 and/or the camera 87 capture images of the alignment marks formed on the substrate 120 and, from the captured images, the alignment unit 85 detects the orientation of the substrate 120 and the amount of positional displacement of the substrate 120 relative to the reference position.

In step S62, the determining unit 88 determines whether the substrate 120 is oriented in the correct direction. If the substrate 120 is not oriented in the correct direction, the determining unit 88 in step S63 sends an alarm signal to the output unit 84, urging the operator to reorient the substrate 120 correctly. Thereafter, the process returns to step S60.

If the substrate 120 is oriented in the correct direction, then in step S64 the substrate 120 is aligned relative to the mounting head 82 by moving the XY stage 81 or the mounting head 82 so as to reduce the amount of positional displacement of the substrate 120 to zero.

In step S65, the electronic component 121 is mounted on the substrate 120 by driving the mounting head 82.

Figure 19:
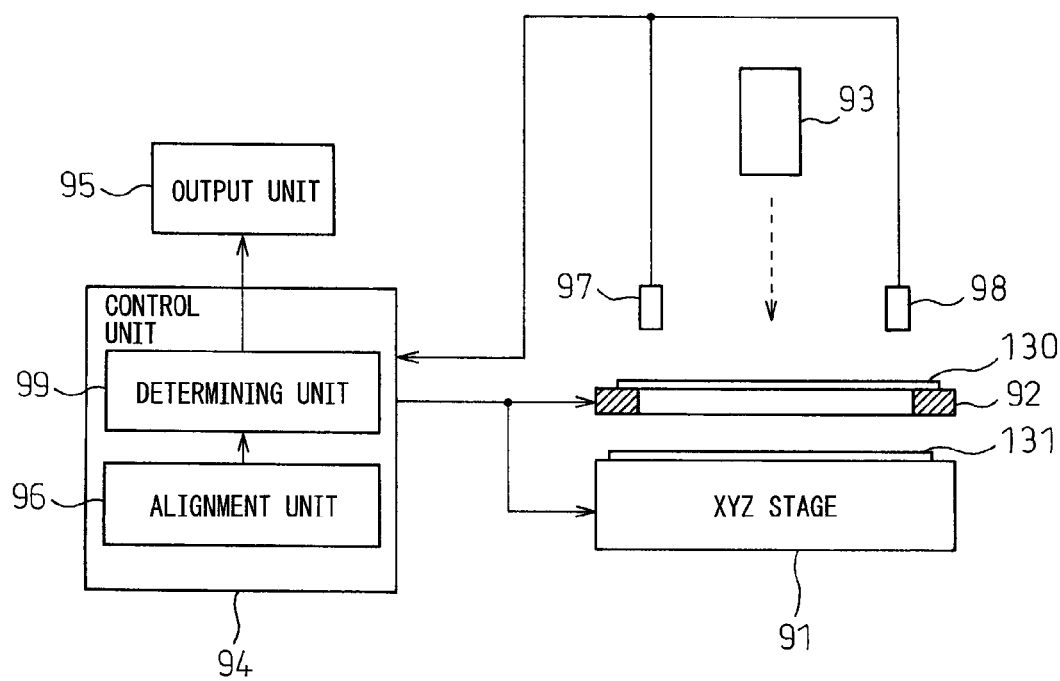
FIG. 19 is a diagram illustrating a fourth configuration example of a fabrication apparatus to which the alignment apparatus according to the embodiment is applied.

FIG. 19 is a diagram illustrating a fourth configuration example of a fabrication apparatus to which the alignment apparatus according to the embodiment is applied. The fabrication apparatus 90 is a fabrication apparatus for fabricating a semiconductor integrated circuit device by projecting light from a light source 93 onto a semiconductor wafer 131 through a photomask 130 thereby exposing to the light the photoresist applied over the surface of the semiconductor wafer 131 and thus transferring a circuit pattern to the semiconductor wafer.

The fabrication apparatus 90 includes: an XYZ stage 91 for mounting thereon the semiconductor wafer 131 and for moving the semiconductor wafer 131 in three-dimensional space; a mask stage 92 for mounting thereon the photomask 130 and for moving the photomask 130 in two-dimensional space; the light source 93; a control unit 94 as a computer or the like for controlling the fabrication apparatus 90; cameras 97 and 98; and an output unit 95 as a display device or printing device for outputting a message for an operator from the control unit 97 or for outputting images captured by the camera 97 and/or the camera 98.

The photomask 130 and the semiconductor wafer 131 are provided with alignment marks such as described with reference to FIG. 2, FIG. 4A, FIG. 10A, FIG. 10B, FIG. 12A, FIG. 12B, etc., and the camera 97 and/or the camera 98 capture images of the alignment marks formed on the photomask 130 and the semiconductor wafer 131.

The control unit 94 includes an alignment unit 96 and a determining unit 99 which are identical in function to the alignment apparatus 10 and the determining unit 15, respectively, described with reference to FIG. 1. The control unit 94 may implement the functions of the alignment unit 96 and the determining unit 99 by executing prescribed programs on a computer, or the alignment unit 96 and the determining unit 99 may each be implemented using dedicated hardware.

The alignment unit 96 takes as inputs the images that the camera 97 and/or the camera 98 captured of the alignment marks formed on the photomask 130 and the semiconductor wafer 131, aligns the photomask 130 and the semiconductor wafer 131 relative to each other by moving the XYZ stage 91 and/or the mask stage 92, and detects the orientations of the photomask 130 and the semiconductor wafer 131.

Based on the orientations of the photomask 130 and the semiconductor wafer 131 detected by the alignment unit 96, the determining unit 99 determines whether the photomask 130 and the semiconductor wafer 131 mounted on the mask stage 92 and the XYZ stage 91, respectively, are oriented in the correct direction; if the photomask 130 and the semiconductor wafer 131 are not oriented correctly, the determining unit 99 sends an alarm signal to the output unit 95.

Figure 20:
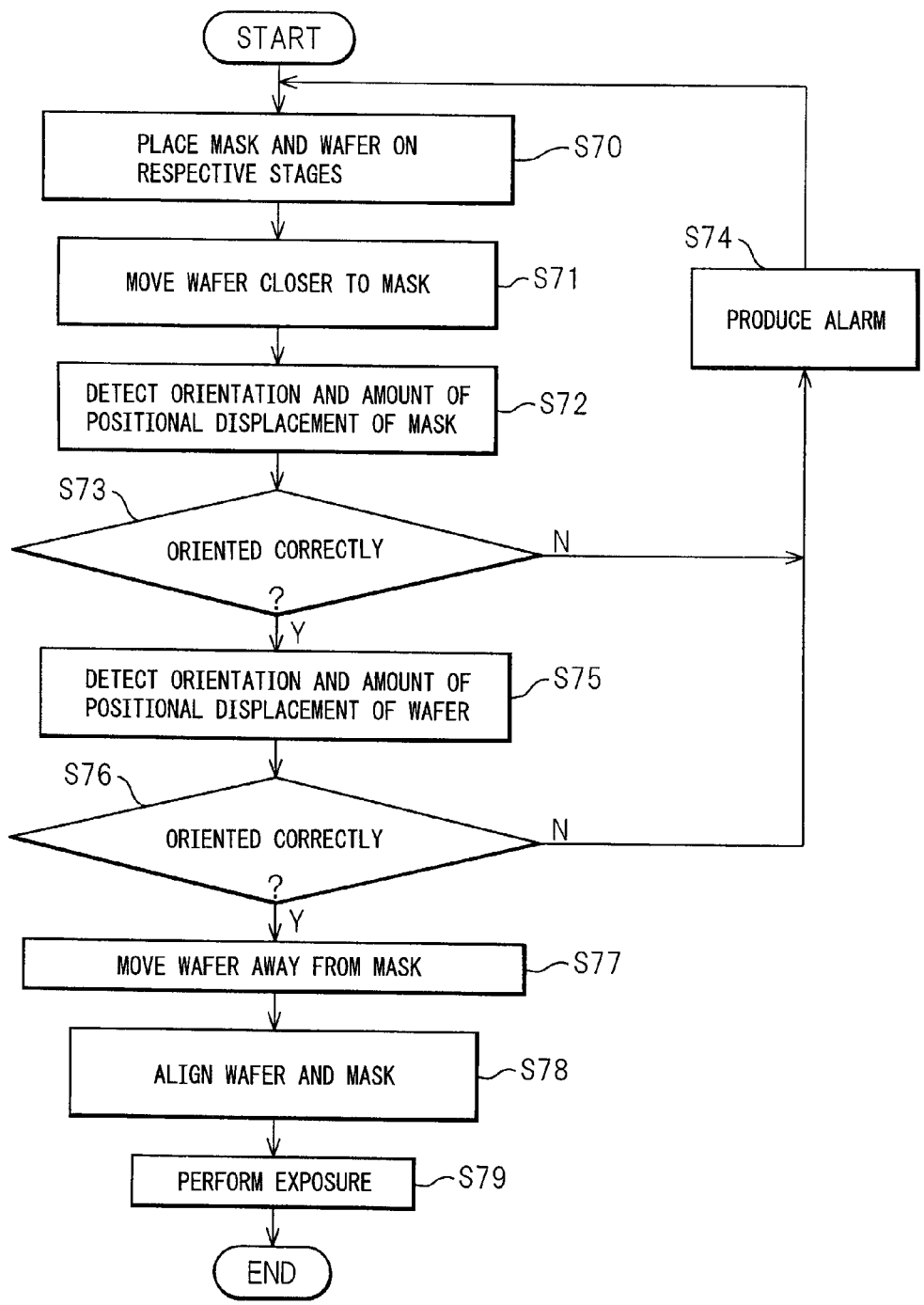
FIG. 20 is a flowchart of a fabrication method for use with the fabrication apparatus depicted in FIG. 19.

FIG. 20 is a flowchart of a fabrication method for use with the fabrication apparatus depicted in FIG. 19. In step S70, the operator places the photomask 130 on the mask stage 92 and the semiconductor wafer 131 on the XYZ stage 91.

In step S71, the XYZ stage 91 is moved upward to move the semiconductor wafer 131 closer to the photomask 130 so that the alignment marks provided on the photomask 130 and the semiconductor wafer 131 are brought into the depth of field of the cameras 97 and 98.

In step S72, the camera 97 and/or the camera 98 capture images of the alignment marks formed on the photomask 130 and, from the captured images, the alignment unit 96 detects the orientation of the photomask 130 and the amount of positional displacement of the photomask 130 relative to the reference position.

In step S73, the determining unit 99 determines whether the photomask 130 is oriented in the correct direction. If the photomask 130 is not oriented in the correct direction, the determining unit 99 in step S74 sends an alarm signal to the output unit 95, urging the operator to reorient the photomask 130 correctly. Thereafter, the process returns to step S70.

If the photomask 130 is oriented in the correct direction, then in step S75 the camera 97 and/or the camera 98 capture images of the alignment marks formed on the semiconductor wafer 131 and, from the captured images, the alignment unit 96 detects the orientation of the semiconductor wafer 131 and the amount of positional displacement of the semiconductor wafer 131 relative to the reference position.

In step S76, the determining unit 99 determines whether the semiconductor wafer 131 is oriented in the correct direction. If the semiconductor wafer 131 is not oriented in the correct direction, the determining unit 99 in step S74 sends an alarm signal to the output unit 95, urging the operator to reorient the semiconductor wafer 131 correctly. Thereafter, the process returns to step S70.

If the semiconductor wafer 131 is oriented in the correct direction, in step S77 the XYZ stage 91 is moved downward to move the semiconductor wafer 131 away from the photomask 130 so as to provide suitable spacing therebetween for exposure.

In step S78, from the amounts of positional displacement of the photomask 130 and the semiconductor wafer 131, the alignment unit 96 determines the amount of positional displacement between the photomask 130 and the semiconductor wafer 131. Then, the alignment unit 96 aligns the photomask 130 and the semiconductor wafer 131 relative to each other by moving the XYZ stage 91 and/or the mask stage 92 so as to reduce the thus determined amount of positional displacement to zero.

In step S79, light from the light source 93 is projected onto the semiconductor wafer 131 through the photomask 130 thereby exposing to the light the photoresist applied over the surface of the semiconductor wafer 131.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An alignment apparatus for a planar member, comprising:
    an image capturing unit which captures an image of a rotationally asymmetrical alignment mark provided on said planar member;
    a position detection unit which detects a position of said alignment mark from said image;
    a position adjusting unit which adjusts, based on the position of said alignment mark, the position of said planar member relative to a reference position; and
    an orientation detection unit which detects an orientation of said planar member based on the rotational asymmetry of said alignment mark captured in said image.

2. The alignment apparatus as claimed in claim 1, wherein said alignment mark is provided with rotational asymmetry for each said alignment mark whose position is to be detected by said position detection unit.

3. The alignment apparatus as claimed in claim 1, wherein said planar member has unequal dimensions in vertical and horizontal directions, and
    said alignment mark is not line symmetrical in shape about a line extending along either one of said vertical and horizontal directions.

4. The alignment apparatus as claimed in claim 1, wherein said alignment mark is line asymmetrical in shape.

5. The alignment apparatus as claimed in claim 1, wherein said alignment mark includes a collection of four geometric figures each placed in one of four quadrants, and is made rotationally asymmetrical in shape by forming at least one of said four geometric figures in a different shape than the others.

6. The alignment apparatus as claimed in claim 1, wherein said alignment mark is formed by combining a rotationally symmetrical geometric figure with a rotationally asymmetrical geometric figure placed within said rotationally symmetrical geometric figure.

7. A fabrication apparatus, equipped with the alignment apparatus of claim 1, for fabricating a multilayered component by laminating together a plurality of said planar members, said planar members being transparent in structure, wherein
    when laminating together said plurality of planar members, said alignment apparatus aligns said planar members with respect to each other, and detects the orientation of at least one of said planar members placed on said fabrication apparatus, and said fabrication apparatus includes a determining unit which, based on said detected orientation, determines whether said planar member is oriented correctly on said fabrication apparatus.

8. A fabrication apparatus, equipped with the alignment apparatus of claim 1, for fabricating a transparent planar component by processing said planar member, said planar member being transparent in structure, wherein said alignment apparatus performs positioning of said planar member placed on said fabrication apparatus, and detects the orientation of said planar member placed on said fabrication apparatus, and said fabrication apparatus includes a determining unit which, based on said detected orientation, determines whether said planar member is oriented correctly on said fabrication apparatus.

9. A fabrication apparatus, equipped with the alignment apparatus of claim 1, for fabricating a circuit substrate by processing said planar member as a substrate and/or mounting an electronic component on said substrate, wherein said alignment apparatus performs positioning of said substrate placed on said fabrication apparatus, and detects the orientation of said substrate placed on said fabrication apparatus, and said fabrication apparatus includes a determining unit which, based on said detected orientation, determines whether said substrate is oriented correctly on said fabrication apparatus.

10. A fabrication apparatus, equipped with the alignment apparatus of claim 1, for fabricating a semiconductor integrated circuit device by transferring a circuit pattern onto a semiconductor wafer using a mask, wherein said alignment apparatus aligns said mask and said semiconductor wafer, as said planar member, relative to each other on said fabrication apparatus, and detects the orientation of said mask and/or said semiconductor wafer placed on said fabrication apparatus, and said fabrication apparatus includes a determining unit which, based on said detected orientation, determines whether said mask and/or said semiconductor wafer are oriented correctly on said fabrication apparatus.

11. An alignment method for a planar member, comprising:

capturing an image of a rotationally asymmetrical alignment mark provided on said planar member;

detecting a position of said alignment mark from said image;

adjusting, based on the position of said alignment mark, the position of said planar member relative to a reference position; and detecting an orientation of said planar member based on the rotational asymmetry of said alignment mark captured in said image.

12. The alignment method as claimed in claim 11, wherein said alignment mark is provided with rotational asymmetry for each said alignment mark.

13. The alignment method as claimed in claim 11, wherein said planar member has unequal dimensions in vertical and horizontal directions, and said alignment mark is not line symmetrical in shape about a line extending along either one of said vertical and horizontal directions.

14. The alignment method as claimed in claim 11, wherein said alignment mark is line asymmetrical in shape.

15. The alignment method as claimed in claim 11, wherein said alignment mark includes a collection of four geometric figures each placed in one of four quadrants, and is made rotationally asymmetrical in shape by forming at least one of said four geometric figures in a different shape than the others.

16. The alignment method as claimed in claim 11, wherein said alignment mark is formed by combining a rotationally symmetrical geometric figure with a rotationally asymmetrical geometric figure placed within said rotationally symmetrical geometric figure.

17. A fabrication method, using the alignment method of claim 11 for positioning of a plurality of said planar members, for fabricating a multilayered component using a fabrication apparatus that fabricates said multilayered component by laminating together said plurality of planar members, said planar members being transparent in structure, wherein when laminating together said plurality of planar members, aligning said planar members with respect to each other, and detecting the orientation of at least one of said planar members placed on said fabrication apparatus by said alignment method, and based on said detected orientation, a determining as to whether said planar member is oriented correctly on said fabrication apparatus.

18. A fabrication method, using the alignment method of claim 11 for positioning of a plurality of said planar members, for fabricating a transparent planar component using a fabrication apparatus that fabricates said transparent planar component by processing said planar member, said planar member being transparent in structure, wherein positioning said planar member placed on said fabrication apparatus, and detecting the orientation of said planar member placed on said fabrication apparatus by said alignment method, and based on said detected orientation, determining as to whether said planar member is oriented correctly on said fabrication apparatus.

19. A fabrication method, using the alignment method of claim 11 for positioning of a plurality of said planar members, for fabricating a circuit substrate using a fabrication apparatus that fabricates said circuit substrate by processing said planar member as a substrate and/or mounting an electronic component on said substrate, wherein positioning said substrate placed on said fabrication apparatus, and detecting the orientation of said substrate placed on said fabrication apparatus by said alignment method, and based on said detected orientation, a determining as to whether said substrate is oriented correctly on said fabrication apparatus.

20. A fabrication method, using the alignment method of claim 11 for aligning a mask and a semiconductor wafer, as said planar member, relative to each other, for fabricating a semiconductor integrated circuit device using a fabrication apparatus that fabricates said semiconductor integrated circuit device by transferring a circuit pattern onto said semiconductor wafer using said mask, wherein positioning said mask placed on said fabrication apparatus, and detecting the orientation of said mask and/or said semiconductor wafer placed on said fabrication apparatus by said alignment method, and based on said detected orientation, determining as to whether said mask and/or said semiconductor wafer are oriented correctly on said fabrication apparatus.

* * * * *